US012393211B2

(12) United States Patent
Tu et al.

(10) Patent No.: US 12,393,211 B2
(45) Date of Patent: Aug. 19, 2025

(54) CONTROL CIRCUIT, CONTROL METHOD AND ELECTRONIC DEVICE

(71) Applicant: Nuvoton Technology Corporation, Hsinchu Science Park (TW)

(72) Inventors: Chieh-Sheng Tu, Hsinchu (TW); Te-Tsoung Tsai, Hsinchu County (TW); Ta-Chin Chiu, Hsinchu Science Park (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 105 days.

(21) Appl. No.: 18/308,344

(22) Filed: Apr. 27, 2023

(65) Prior Publication Data

US 2024/0069583 A1 Feb. 29, 2024

(30) Foreign Application Priority Data

Aug. 30, 2022 (TW) .................................. 111132637

(51) Int. Cl.
*G05F 1/46* (2006.01)
*G06F 1/08* (2006.01)
*H03K 5/24* (2006.01)

(52) U.S. Cl.
CPC .................. *G05F 1/46* (2013.01); *G06F 1/08* (2013.01); *H03K 5/24* (2013.01)

(58) Field of Classification Search
CPC ..... G05F 1/46; G06F 1/08; G06F 1/28; G06F 1/30; G06F 1/3206; G06F 1/305;
(Continued)

(56) References Cited

U.S. PATENT DOCUMENTS 6,360,327 B1 * 3/2002 Hobson ................. G06F 1/3203
713/320

FOREIGN PATENT DOCUMENTS

TW          I564703 B     1/2017
TW      201942718 A     11/2019
(Continued)

OTHER PUBLICATIONS

TW Office Action issued on Jun. 30, 2023, for the corresponding Taiwan Application No. 111132637, 7 pages.

*Primary Examiner* — Jung Kim
(74) *Attorney, Agent, or Firm* — Muncy, Geissler, Olds & Lowe, P.C.

(57) ABSTRACT

A control circuit including a storage circuit, a voltage detection circuit, a processing circuit, and a wake-up circuit is provided. The storage circuit includes a register and stores a program code. The voltage detection circuit detects an external voltage. The processing circuit accesses the register in response to the external voltage reaching a first predetermined voltage. The processing circuit enters a power-down mode in response to the external voltage reaching a second predetermined voltage. In the power-down mode, the processing circuit stops accessing the register. The wake-up circuit determines whether a wake-up event occurs. In response to the wake-up event, the wake-up circuit directs the processing circuit to exit the power-down mode and enter an operation mode. In response to there being no wake-up event, the processing circuit stays in the power-down mode. In the operation mode, the processing circuit executes the program code.

20 Claims, 6 Drawing Sheets

(58) Field of Classification Search
CPC .......... G06F 1/3203; G06F 1/32; H03K 5/24; H03K 3/02335; H03K 3/0375; H03K 3/2865; H03K 3/356008; G01R 19/2503; G05B 19/0423; G05B 2219/24215
See application file for complete search history.

(56) References Cited

FOREIGN PATENT DOCUMENTS

| | | | | |
|---|---|---|---|---|
| TW | 202134810 A | | 9/2021 | |
| TW | 202227835 A | * | 7/2022 | ........... G01R 19/165 |

* cited by examiner

CONTROL CIRCUIT, CONTROL METHOD AND ELECTRONIC DEVICE

CROSS REFERENCE TO RELATED APPLICATIONS

This application claims priority of Taiwan Patent Application No. 111132637, filed on Aug. 30, 2022, the entirety of which is incorporated by reference herein.

BACKGROUND OF THE INVENTION

Field of the Invention

The invention relates to a control circuit, and more particularly to a control circuit that can improve power storage capacity.

Description of the Related Art

A conventional control circuit receives external voltage and operates according to said external voltage. When the control circuit starts to run a program, the external voltage will gradually drop due to the power consumption caused by the operation of control circuit. When the external voltage is lower than a low-voltage reset (LVR) voltage, the control circuit is reset. After resetting the control circuit, the external voltage is gradually increased. However, when the control circuit runs the program again, the external voltage drops again. When the external voltage is lower than the LVR voltage, the control circuit is reset again. Since the control circuit is repeatedly reset, it cannot complete the booting action quickly.

BRIEF SUMMARY OF THE INVENTION

In accordance with an embodiment of the disclosure, a control circuit comprises a storage circuit, a voltage detection circuit, a processing circuit, and a wake-up circuit. The storage circuit comprises a register and stores a program code. The voltage detection circuit detects an external voltage. The processing circuit accesses the register in response to the external voltage reaching a first predetermined voltage. The processing circuit enters a power-down mode in response to the external voltage reaching a second predetermined voltage. In the power-down mode, the processing circuit stops accessing the register. The wake-up circuit determines whether a wake-up event occurs. In response to the wake-up event, the wake-up circuit directs the processing circuit to exit the power-down mode and enter an operation mode. In response to there being no wake-up event, the processing circuit stays in the power-down mode. In the operation mode, the processing circuit executes the program code.

In accordance with a further embodiment of the disclosure, a control method applied in a micro-controller is described in the following paragraph. An external voltage is detected. In response to the external voltage reaching a first predetermined voltage, a register is accessed. In response to the external voltage reaching a second predetermined voltage, the micro-controller is directed to enter a power-down mode. In the power-down mode, the micro-controller stops accessing the register. A determination is made as to whether a wake-up event occurs. In response to there being no wake-up event, the micro-controller stays in the power-down mode. In response to the wake-up event, the micro-controller is directed to enter an operation mode. In the operation mode, the micro-controller executes a program code.

In accordance with another embodiment of the disclosure, an electronic device receives a power from an external device and comprises an energy storage circuit, a storage circuit, a voltage detection circuit, a processing circuit, and a wake-up circuit. The energy storage circuit stores the power to provide an external voltage. The storage circuit comprises a register and stores a program code. The voltage detection circuit detects the external voltage. In response to the external voltage reaching a first predetermined voltage, the processing circuit accesses the register. In response to the external voltage reaching a second predetermined voltage, the processing circuit enters a power-down mode. The processing circuit stops accessing the register in the power-down mode. The wake-up circuit determines whether a wake-up event occurs. In response to the wake-up event, the wake-up circuit directs the processing circuit to exit the power-down mode and enter an operation mode. In response to there being no wake-up event, the processing circuit operates in the power-down mode. In the operation mode, the processing circuit executes the program code.

Control method of micro-controller may be practiced by the control circuit or the electronic device which have hardware or firmware capable of performing particular functions and may take the form of program code embodied in a tangible media. When the program code is loaded into and executed by an electronic device, a processor, a computer or a machine, the electronic device, the processor, the computer or the machine becomes the control circuit or the electronic device for practicing the disclosed method.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
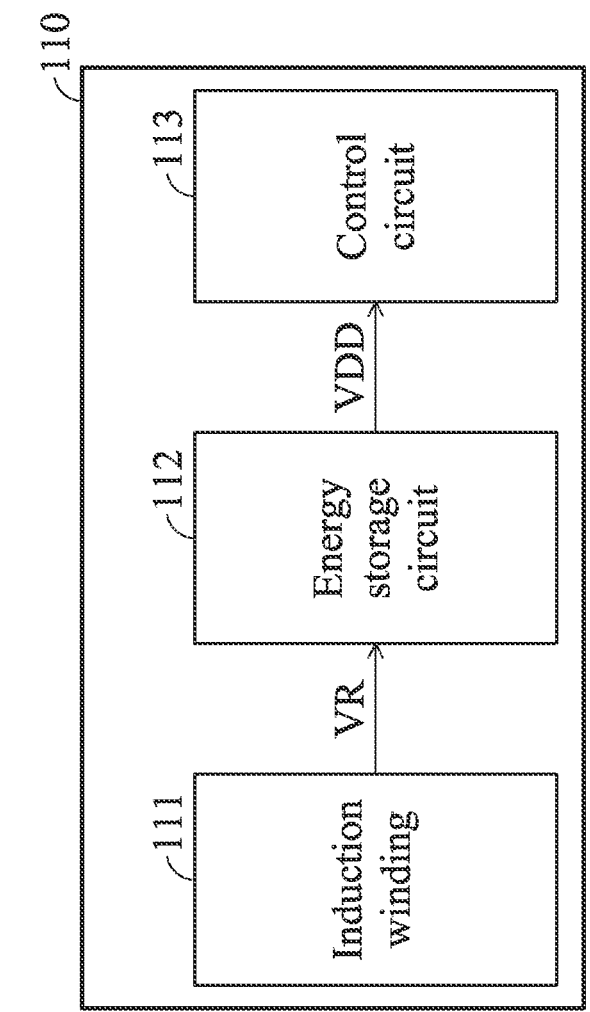
FIG. 1 is a schematic diagram of an exemplary embodiment of an electronic device according to various aspects of the present disclosure.
Figure 1:
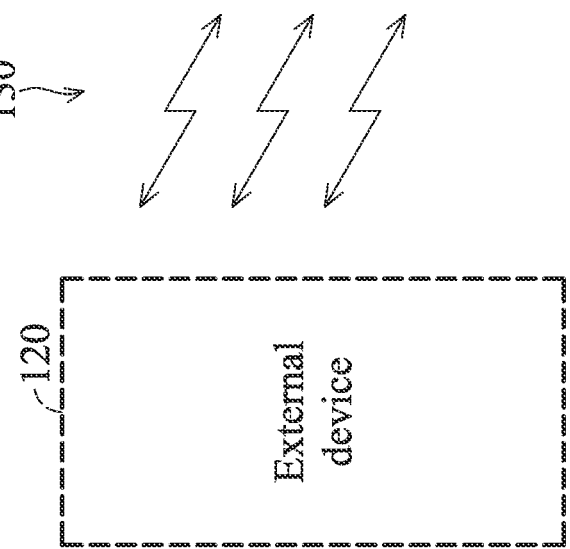

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an electronic device according to various aspects of the present disclosure. The electronic device 110 comprises an induction winding 111, an energy storage circuit 112, and a control circuit 113. The induction winding 111 induces a radio wave 130 and generates an induction voltage VR according to the electrical energy component of the radio wave 130. The induction winding 111 provides the induction voltage VR to the energy storage circuit 112 to charge the energy storage circuit 112. The energy storage circuit 112 stores the induction voltage VR to provide an external voltage VDD. In this embodiment, since the induction winding 111 charges the energy storage circuit 112 continuously, the external voltage is to increase gradually. In some embodiments, when the external voltage VDD reaches a target value, the induction winding 111 stops charging the energy storage circuit 112. The control circuit 113 operates according to the external voltage VDD. In one embodiment, the control circuit 113 is a micro-controller unit (MCU).

The kind of electronic device 110 is not limited in the present disclosure. In one embodiment, the electronic device 110 is a smoke detector or a tag of a radio frequency identification (RFID) system. In this case, an external device 120 emits the radio wave 130 to drive the electronic device 110. The kind of external device 120 is not limited in the present disclosure. In one embodiment, the external device 120 is a reader of the RFID system. In another embodiment, the electronic device 110 is a passive stylus pen. In this case, the external device 120 is a digital pad. In other embodiments, the external device 120 charges the energy storage circuit 112 via a connection line (not shown). In this case, the electronic device 110 does not need the induction winding 111.

Figure 2A:
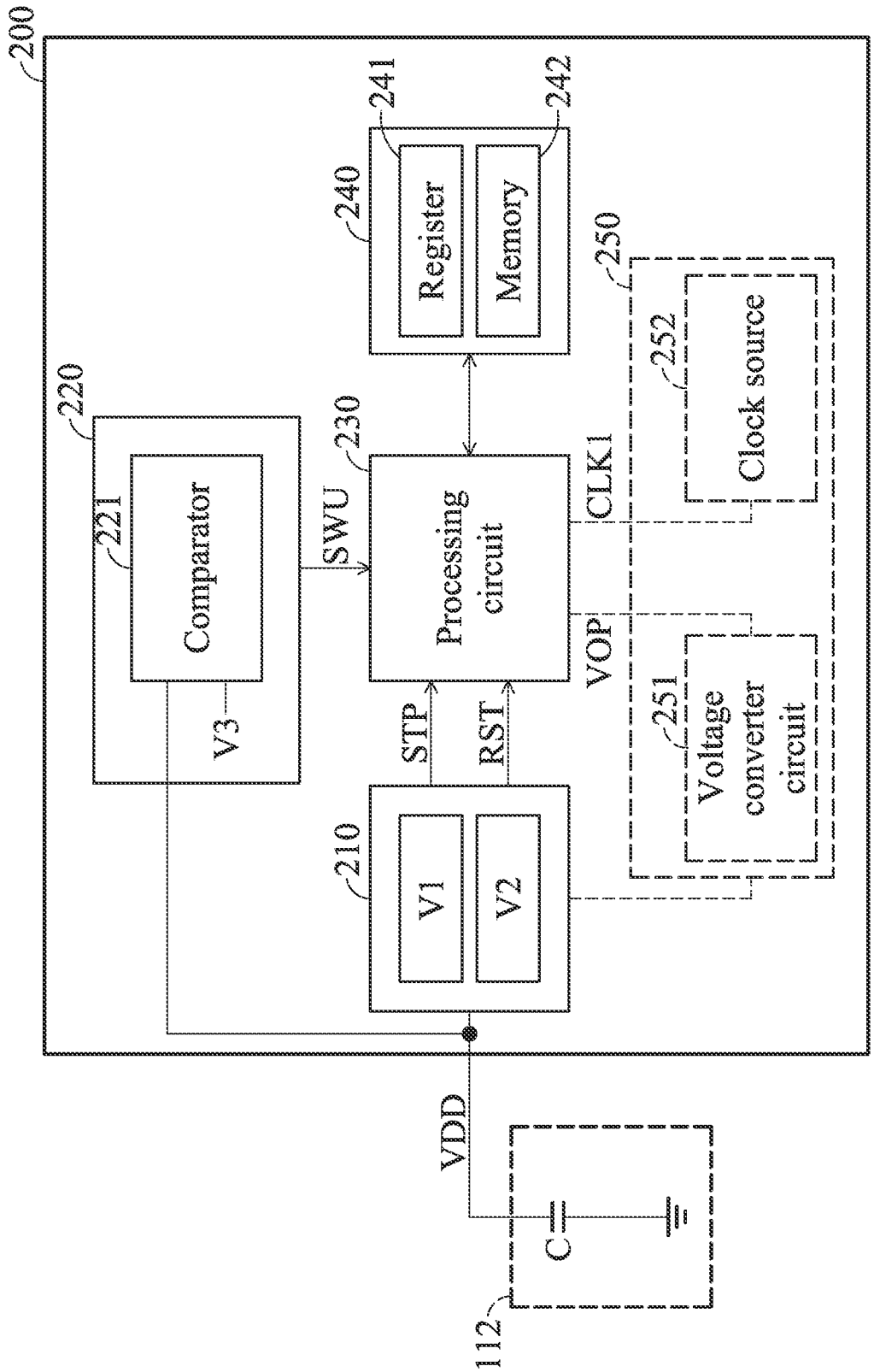
FIG. 2A is a schematic diagram of an exemplary embodiment of a control circuit according to various aspects of the present disclosure.

FIG. 2A is a schematic diagram of an exemplary embodiment of a control circuit according to various aspects of the present disclosure. The control circuit 200 comprises a voltage detection circuit 210, a wake-up circuit 220, a processing circuit 230, and a storage circuit 240. The voltage detection circuit 210 detects an external voltage VDD. In this embodiment, the external voltage VDD is provided by the energy storage circuit 112. As shown in FIG. 2A, the energy storage circuit 112 at least comprises a capacitor C. The voltage stored in the capacitor C is provided as the external voltage VDD.

The voltage detection circuit 210 stores a predetermined voltage V1. In one embodiment, the predetermined voltage V1 is a power-on reset (POR) voltage. When the external voltage VDD is lower than the predetermined voltage V1, the voltage detection circuit 210 enables a stop signal STP. When the external voltage VDD reaches the predetermined voltage V1, the voltage detection circuit 210 enables an initialization signal RST. The structure of voltage detection circuit 210 is not limited in the present disclosure. Any circuit can serve as the voltage detection circuit 210, as long as the circuit is capable of detecting voltages.

The processing circuit 230 receives the stop signal STP and the initialization signal RST. When the stop signal STP is enabled, the processing circuit 230 stops operating. When the initialization signal RST is enabled, the processing circuit 230 enters an initialization mode. In the initialization mode, the processing circuit 230 executes an initializing operation. In one embodiment, the processing circuit 230 initials the register 241 in the storage circuit 240.

The invention does not limit how the processing circuit 230 initializes the register 241. In one embodiment, the processing circuit 230 writes a set value in the register 241. In this case, an element (e.g., a comparator 221) in the control circuit 200 operates according to the value of the register 241. The number of registers in the storage circuit 240 is not limited in the present disclosure. In other embodiments, the storage circuit 240 comprises more registers. In this case, the processing circuit 230 writes a plurality of set values to the registers. In some embodiments, the storage circuit 240 further comprises a memory 242. The memory 242 stores a program code. The type of memory 242 is not limited in the present disclosure. In one embodiment, the memory 242 is a flash memory.

In some embodiments, the control circuit 200 further comprises a driving circuit 250. The driving circuit 250 is configured to drive the processing circuit 230. When the external voltage VDD arrives the predetermined voltage V1, the voltage detection circuit 210 triggers the driving circuit 250. Therefore, the driving circuit 250 provides at least one driving signal (e.g., at least one of the output voltage VOP and the clock signal CLK) to the processing circuit 230. In another embodiment, the driving circuit 250 directly receives the external voltage VDD and determines whether the external voltage VDD arrives the predetermined voltage V1. When the external voltage VDD arrives the predetermined voltage V1, the driving circuit 250 provides the driving signal to the processing circuit 230.

The structure of driving circuit 250 is not limited in the present disclosure. In one embodiment, the driving circuit 250 comprises a voltage converter circuit 251. The voltage converter circuit 251 converts the external voltage VDD to generate the output voltage VOP and provides the output voltage VOP to the processing circuit 230. The invention does not limit how the voltage converter circuit 251 converts the external voltage VDD. In one embodiment, the voltage converter circuit 251 increases or reduces the level of the external voltage VDD. When the processing circuit 230 receives the output voltage VOP, the processing circuit 230 performs an initialization operation, such as to initial the register 241. The structure of voltage converter circuit 251 is not limited in the present disclosure. The voltage converter circuit 251 is a low-dropout regulator (LDO). In another embodiment, the driving circuit 250 comprises a clock source 252. The clock source 252 generates a clock signal CLK1 and provides the clock signal CLK1 to the processing circuit 230. The circuit structure of clock source 252 is not limited in the present disclosure. In one embodiment, the clock source 252 comprises an initial RC oscillator (IRC).

In other embodiments, the processing circuit 230 operates in a corresponding mode according to the frequency of the clock signal CLK1. For example, when the frequency of the clock signal CLK1 is equal to a first value, the processing circuit 230 enters a standby mode. When the frequency of the clock signal CLK1 is equal to a second value, the processing circuit 230 enters an operation mode. The first value is lower than the second value. For example, the first value may be 1 MHz, and the second value may be 4 MHz, 8 MHz, 24 MHz, or 48 MHz.

In some embodiment, the voltage detection circuit 210 further stores a predetermined voltage V2. The predetermined voltage V2 is higher than the predetermined voltage V1. When the external voltage VDD reaches the predetermined voltage V2, the processing circuit 230 enters a power-down mode. In the power-down mode, the processing circuit 230 stops performing the initialization operation. In this embodiment, the predetermined voltage V2 is slightly greater than the a low-voltage reset (LVR) voltage. In some embodiments, when the external voltage VDD drops gradually and is lower than the LVR voltage, the processing circuit 230 re-performs the initialization operation.

The wake-up circuit 220 is coupled to the processing circuit 230 and determines whether a wake-up event occurs. In this embodiment, when the external voltage VDD arrives at the predetermined voltage V2, the wake-up circuit 220 determines whether a wake-up event occurs. When there is no wake-up event, the wake-up circuit 220 does not wake-up the processing circuit 230. Therefore, the processing circuit 230 continues to operate in the power-down mode. However, when an wake-up event occurs, the wake-up circuit 220 wakes-up the processing circuit 230. Therefore, the processing circuit 230 exits the power-down mode and enters an operation mode. In the operation mode, the processing circuit 230 accesses the memory 242 to execute the program code stored in the memory 242.

In one embodiment, the wake-up event is the external voltage VDD reaching a predetermined voltage V3. The invention does not limit how the wake-up circuit 220 determines whether the external voltage VDD has reached the predetermined voltage V3. In one embodiment, the wake-up circuit 220 comprises a comparator 221. The comparator 221 compares the external voltage VDD and the predetermined voltage V3. When the external voltage VDD has not reached the predetermined voltage V3, the comparator 221 does not enable a wake-up signal SWU. Therefore, the processing circuit 230 continues to operate in the power-down mode. When the external voltage VDD reaches the predetermined voltage V3, the comparator 221 enables the wake-up signal SWU. Therefore, the processing circuit 230 exits the power-down mode and enters the operation mode. In one embodiment, after the processing circuit 230 enters the operation mode, the wake-up circuit 220 stops determining whether the wake-up event occurs. Therefore, the power consumption of the control circuit 200 can be reduced. In some embodiments, after the processing circuit 230 is waked up by the wake-up circuit 220, the processing circuit 230 ignores the wake-up signal SWU. In this case, the processing circuit 230 may re-enter the power-down mode or exits the power-down mode according to the program code in the memory 242.

In some embodiments, the wake-up circuit 220 at least comprises a register (not shown). In this case, when the external voltage VDD reaches the predetermined voltage V1, the processing circuit 230 performs an initialization operation. The initialization operation is to write at least set value to the register of the wake-up circuit 220 to initial the comparator 221.

In this embodiment, the predetermined voltage V3 is higher than the predetermined voltage V2, and the predetermined voltage V2 is higher than the predetermined voltage V1. For example, the predetermined voltage V3 may be 4V, the predetermined voltage V2 may be 1.8V, and the predetermined voltage V1 may be 1.2V.

Figure 2B:
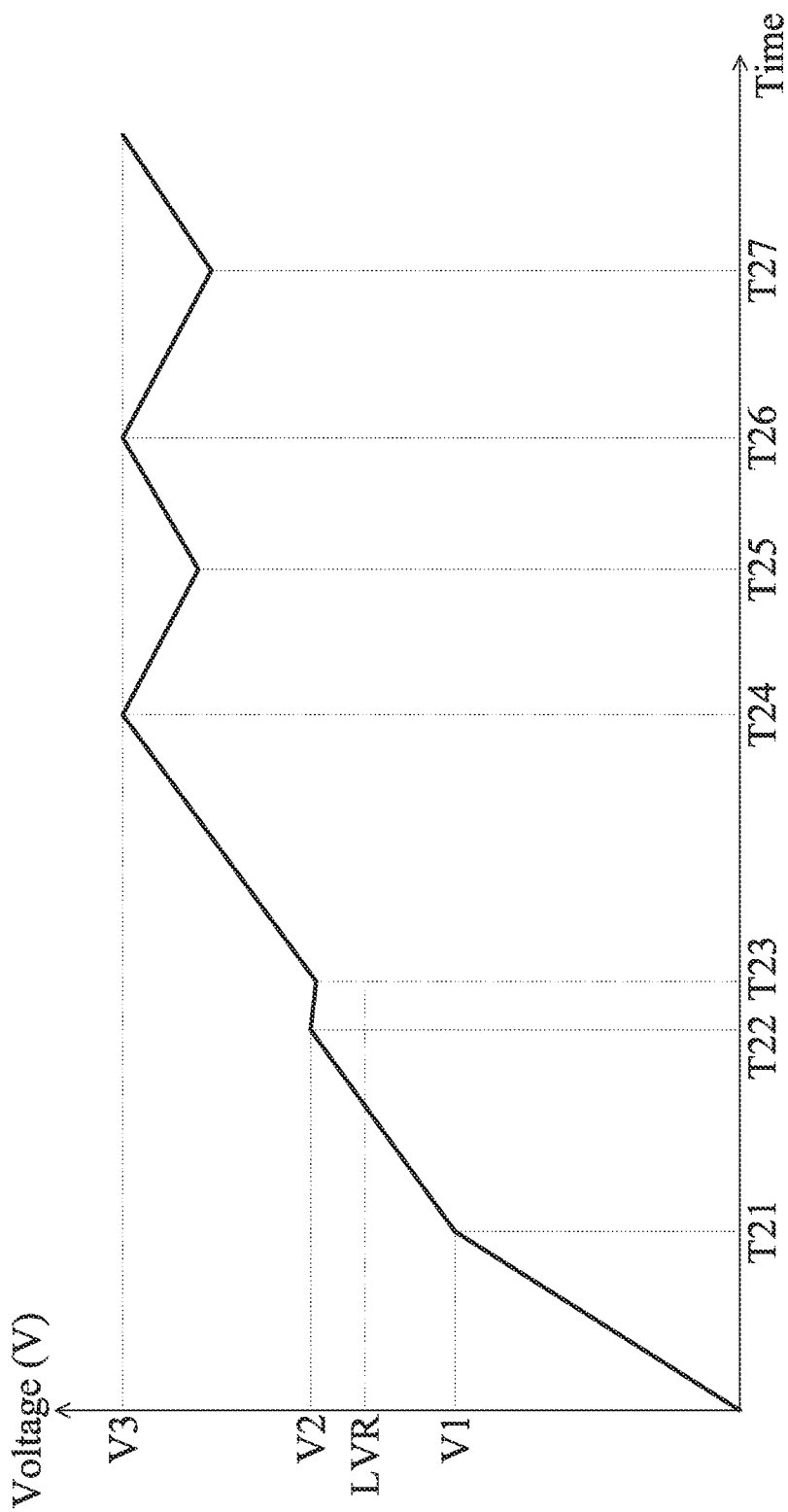
FIG. 2B is a schematic diagram of an exemplary embodiment of an external voltage according to various aspects of the present disclosure.

FIG. 2B is a schematic diagram of an exemplary embodiment of the external voltage according to various aspects of the present disclosure. Before time point T21, since the induction winding 111 charges the energy storage circuit 112, the external voltage VDD generated by the energy storage circuit 112 is increased gradually. Since the external voltage VDD is lower than the predetermined voltage V1, the processing circuit 230 does not operate.

At time point T21, the external voltage VDD reaches the predetermined voltage V1. Therefore, the processing circuit 230 enters an initialization mode, in the initialization mode, the processing circuit 230 performs an initialization operation. When the processing circuit 230 performs the initialization operation, it does not cause too much power consumption, so the external voltage VDD continually to rise.

At time point T22, since the external voltage VDD reaches the predetermined voltage V2, the processing circuit 230 enters a power-down mode to temporarily stop performing the initialization operation. Before the processing circuit 230 enters the power-down mode, the external voltage VDD is slightly reduced. Since the external voltage VDD is not lower than the LVR voltage, it will not cause the processing circuit 230 to perform a reset operation, such as to initial the register 241.

At time point T23, since the processing circuit 230 has enter the power-down mode, the external voltage VDD increases gradually. At this time, the wake-up circuit 220 starts operating to determine whether a wake-up event occurs.

At time point T24, since the external voltage VDD has reached the predetermined voltage V3, the wake-up circuit 220 wakes the processing circuit 230 up. Therefore, the processing circuit 230 exits the power-down mode and enters an operation mode. In the operation mode, the processing circuit 230 performs the program code of the memory 242. When the processing circuit 230 performs the program code, the processing circuit 230 causes the power consumption so that the external voltage VDD is reduced gradually.

At time point T25, the processing circuit 230 enters the power-down mode according to the program code stored in the memory 242. Since the processing circuit 230 stops operating, the external voltage VDD is gradually increased at time point T25.

At time point T26, the processing circuit 230 exits the power-down mode and enters the operation mode according to the program code stored in the memory 242. In the operation mode, the processing circuit 230 performs the program code stored in the memory 242 so that the external voltage VDD is gradually reduced.

At time point T27, the processing circuit 230 enters the power-down mode according to the program code of the memory 242. Since the processing circuit 230 stops operating, the external voltage VDD is gradually increased after time point T27.

In this embodiment, when the external voltage VDD reaches the predetermined voltage V2, the processing circuit 230 enters the power-down mode to reduce the power consumption. Therefore, the external voltage VDD is stably and gradually increased. When the external voltage VDD reaches the predetermined voltage V3, it means that the external voltage VDD is sufficient. At this time, even if the processing circuit 230 performs the program code stored in the memory 242, the external voltage VDD is not lower than the LVR voltage to avoid the processing circuit 230 from performing a reset operation many times.

Figure 3A:
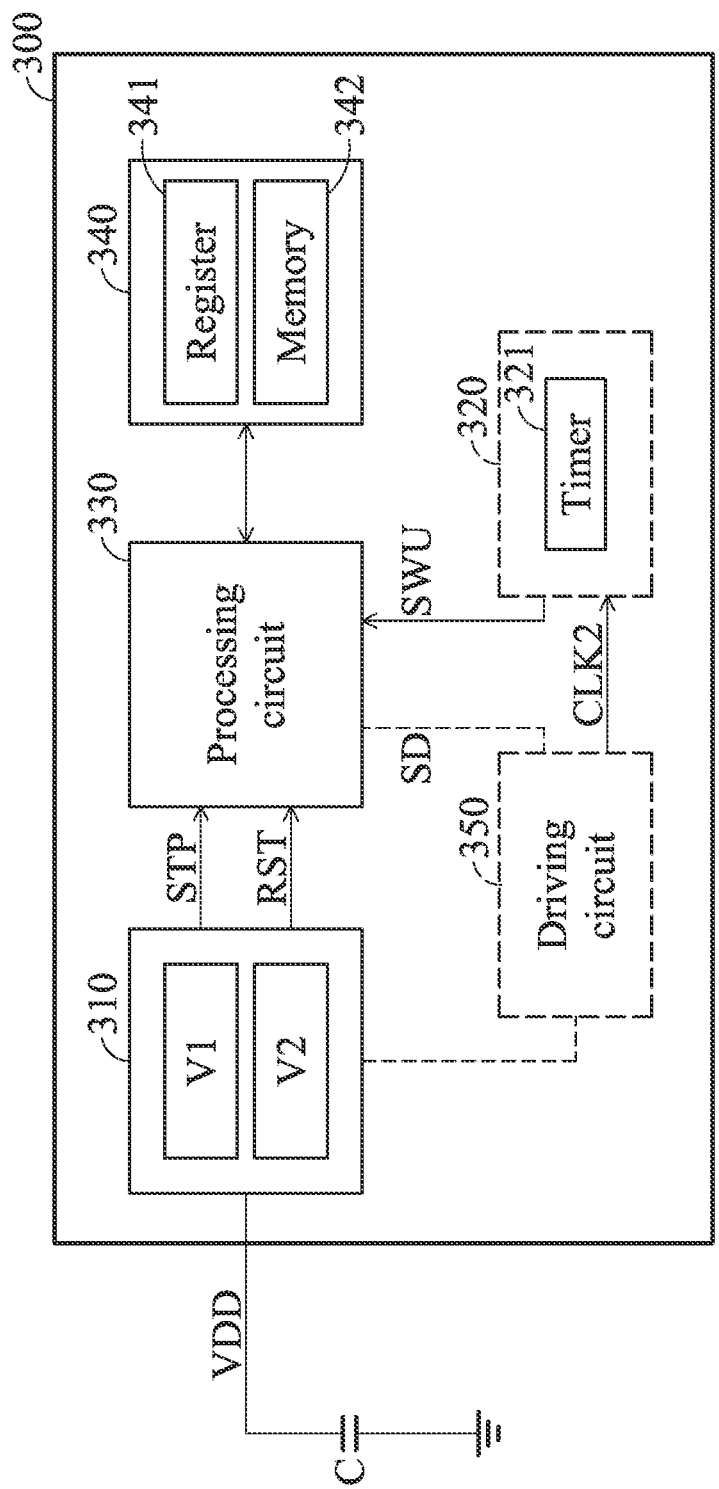
FIG. 3A is a schematic diagram of another exemplary embodiment of the control circuit according to various aspects of the present disclosure.

FIG. 3A is a schematic diagram of another exemplary embodiment of the control circuit according to various aspects of the present disclosure. The control circuit 300 of FIG. 3A is similar to the control circuit 200 of FIG. 2A with the exception that the wake-up circuit 320 of FIG. 3A is a timer 321. Since the characteristics of the voltage detection circuit 310, the processing circuit 330, and the storage circuit 340 shown in FIG. 3A are similar to the characteristics of the voltage detection circuit 210, the processing circuit 230, and the storage circuit 240 shown in FIG. 2A, the related description is omitted here.

When the external voltage VDD reaches the predetermined voltage V2, the processing circuit 330 enters the power-down mode. In this case, the wake-up circuit 320 determines whether the duration of the processing circuit 330 being in the power-down mode has reached a predetermined value (e.g., 4 seconds). When the duration of the processing circuit 330 being in the power-down mode has not reached a predetermined value, the wake-up circuit 320 does not wake up the processing circuit 330. However, when the duration of the processing circuit 330 being in the power-down mode has reached a predetermined value, the wake-up circuit 320 wakes up the processing circuit 330. Therefore, the processing circuit 330 exits the power-down mode and enters the operation mode. In one embodiment, after the wake-up circuit 320 wakes the processing circuit 330 up, the wake-up circuit 320 stops working. In this case, once the processing circuit 330 is woken up, the processing circuit 330 is no longer controlled by the wake-up circuit 320.

In this embodiment, the wake-up circuit 320 is a timer 321. The timer 321 counts the number of pulses of a clock signal CLK2 and adjusts a counter value according to the number of pulses of the clock signal CLK2. When the counter value has not reached a target value, it means that the duration of the processing circuit 330 being in the power-down mode has not reached a predetermined value. Therefore, the timer 321 does not enable the wake-up signal SWU so that the processing circuit 330 stays in the power-down mode. When the counter value has reached a target value, it means that the duration of the processing circuit 330 being in the power-down mode has reached a predetermined value. Therefore, the timer 321 enables the wake-up signal SWU so that the processing circuit 330 exits the power-down mode and enters the operation mode.

In some embodiments, when the external voltage VDD reaches the predetermined voltage V1, the processing circuit 330 writes a set value to the register 341. In this case, the timer 321 operates according to the value of the register 341. In another embodiment, the wake-up circuit 320 further comprises a register (not shown). When the external voltage VDD reaches the predetermined voltage V1, the processing circuit 330 writes a set value to the register of the wake-up circuit 320. In this case, the timer 321 operates according to the set value of the register in the wake-up circuit 320.

The source providing the clock signal CLK2 is not limited in the present disclosure. In one embodiment, the clock signal CLK2 is provided by the driving circuit 350. In this case, the driving circuit 350 may comprise a first clock source (not shown) and a second clock source (not shown). The first clock source is configured to provide the clock signal CLK2. The second clock source is configured to provide a driving signal SD to the processing circuit 330. In this case, the driving signal SD is a clock signal (e.g., the clock signal CLK1 of FIG. 2A). In other embodiments, the driving circuit 350 comprises a voltage converter circuit (not shown) to provide power to the processing circuit 330. In this case, the voltage provided by the driving circuit 350 is served as the driving signal SD.

Figure 3B:
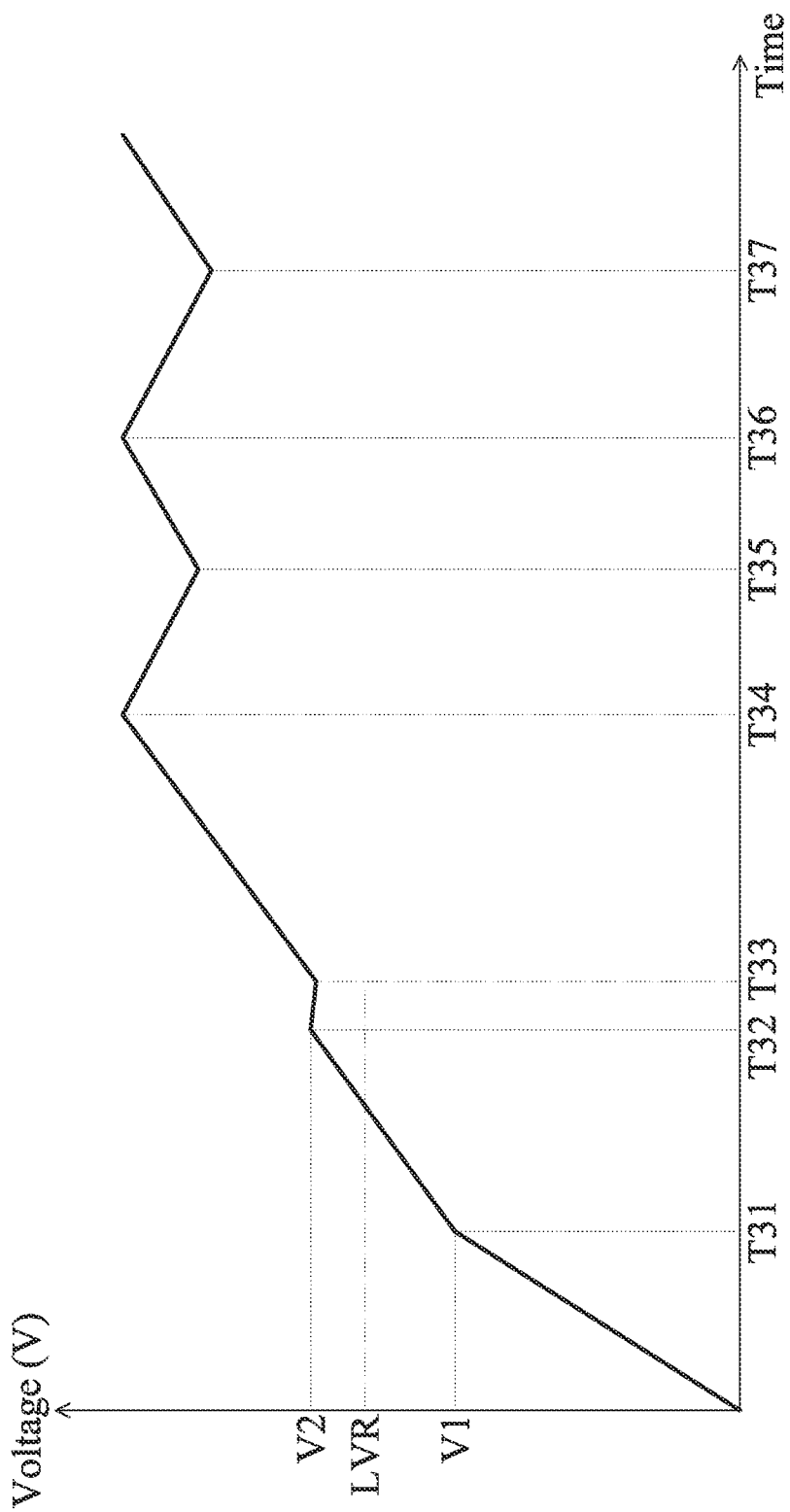
FIG. 3B is a schematic diagram of another exemplary embodiment of the external voltage according to various aspects of the present disclosure.

FIG. 3B is a schematic diagram of another exemplary embodiment of the external voltage according to various aspects of the present disclosure. FIG. 3B is similar to FIG. 2B except that the time point T34 of FIG. 3B is different from time point T24 of FIG. 2B. In FIG. 2B, time point T24 is the time point at which the external voltage VDD reaches the predetermined voltage V3. In FIG. 3B, time point T34 is the time point at which the duration of the processing circuit 330 being in the power-down mode reaches a predetermined value.

In FIG. 3B, at time point T33, the processing circuit 330 enters the power-down mode and the timer 321 starts to count. At time point T34, the duration of the processing circuit 330 entering the power-down mode reaches a predetermined value. Therefore, the timer 321 enables the wake-up signal SWU so that the processing circuit 330 exits the power-down mode and enters the operation mode. Since the characteristics of time points T31-T33 and T35-T37 shown in FIG. 3B are similar to the characteristics of time points T21-T23 and T25-T27 shown in FIG. 2B, the related description is omitted here.

Figure 4:
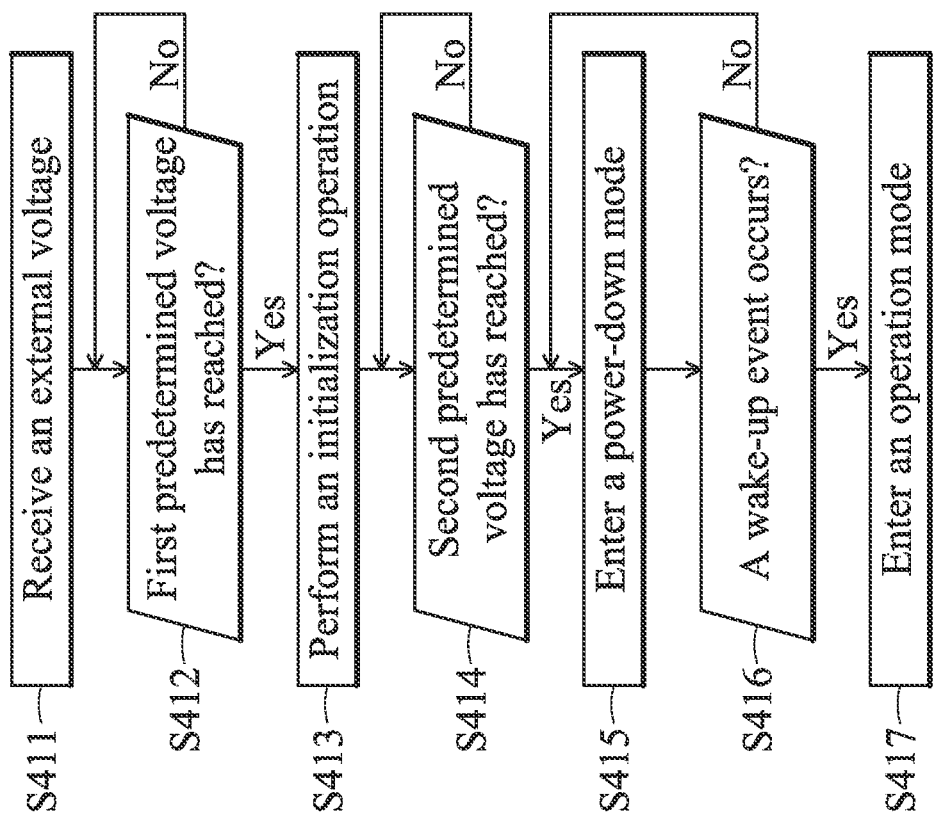
FIG. 4 is a flowchart of an exemplary embodiment of a control method, according to various aspects of the present disclosure.

FIG. 4 is a flowchart of an exemplary embodiment of a control method, according to various aspects of the present disclosure. The control method is applied in a micro-controller. First, an external voltage is received (step S411). In one embodiment, the external voltage is provided by a capacitor. In this case, the capacitor is disposed outside of the micro-controller.

Then, a determination is made as to whether the external voltage has reached a first predetermined voltage (step S412). When the external voltage reaches the first predetermined voltage, an initialization operation is performed (step S413). In one embodiment, the initialization operation is to write a set parameter to a register. The register may be disposed in the micro-controller. In one embodiment, step S413 is further to convert the external voltage to generate a driving voltage to the micro-controller. In another embodiment, a clock signal is generated in step S413 and sent to the micro-controller. In other embodiments, when the external voltage has not reached the first predetermined voltage, the micro-controller is deactivated. Therefore, the micro-controller does not operate.

Then, a determination is made as to whether the external voltage has reached a second predetermined voltage (step S414). When the external voltage reaches the second predetermined voltage, the micro-controller is controlled to enter a power-down mode (step S415). In the power-down mode, the micro-controller stops accessing the register.

Next, a determination is made as to whether a wake-up event occurs (step S416). When the wake-up event does not occur, the micro-controller is controlled to stay in the power-down mode. When the wake-up event occurs, the micro-controller is controlled to enter an operation mode (step S417). In the operation mode, the micro-controller executes a program code. In one embodiment, when the micro-controller enters the operation mode, stop determining whether the wake-up event occurs.

In one embodiment, the wake-up event is the external voltage reaching a third predetermined voltage. In this case, when the external voltage has not reached the third predetermined voltage, the micro-controller is controlled to operate in the power-down mode. When the external voltage reaches the third predetermined voltage, the micro-controller is woken up. The micro-controller exits the power-down mode and enters the operation mode. In this case, the third predetermined voltage is greater than the second predetermined voltage, and the second predetermined voltage is greater than the first predetermined voltage.

In another embodiment, the wake-up event is the duration of the micro-controller operating in the power-down mode reaching a predetermined value. In this case, when the external voltage reaches the second predetermined voltage and the micro-controller enters the power-down mode, a timer is activated. Therefore, the timer adjusts a counter value. Next, a determination is made as to whether the counter value has reached a target value. When the counter value has not reached a target value, it means that the duration for which the micro-controller operates in the power-down mode has not reached a predetermined value. Therefore, the micro-controller is controlled to operate in the power-down mode. When the counter value has reached a target value, it means that the duration for which the micro-controller operates in the power-down mode has reached a predetermined value. Therefore, the micro-controller is woken up. The micro-controller exits the power-down mode and enters the operation mode.

Control methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes a control circuit or an electronic device for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes a control circuit or an electronic device for practicing the disclosed methods. When implemented on a general-purpose processor, the program code combines with the processor to provide a unique apparatus that operates analogously to application-specific logic circuits.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A control circuit comprising:
   a storage circuit comprising a register and storing a program code;
   a voltage detection circuit detecting an external voltage;
   a processing circuit accessing the register in response to the external voltage reaching a first predetermined voltage, and entering a power-down mode in response to the external voltage reaching a second predetermined voltage, wherein in the power-down mode, the processing circuit stops accessing the register; and
   a wake-up circuit detecting whether a wake-up event occurs,
   wherein:
   in response to the wake-up event, the wake-up circuit directs the processing circuit to exit the power-down mode and enter an operation mode,
   in response to there being no wake-up event, the processing circuit operates in the power-down mode, and
   in the operation mode, the processing circuit executes the program code.

2. The control circuit as claimed in claim 1, wherein in response to the external voltage not reaching the first predetermined voltage, the voltage detection circuit deactivates the processing circuit, and in response to the external voltage reaching the first predetermined voltage, the voltage detection circuit enables an initialization signal so that the processing circuit starts to access the register.

3. The control circuit as claimed in claim 1, wherein:
   the wake-up event is the external voltage reaching a third predetermined voltage,
   the third predetermined voltage is higher than the second predetermined voltage, and the second predetermined voltage is higher than the first predetermined voltage.

4. The control circuit as claimed in claim 3, wherein:
   the wake-up circuit is a comparator,
   in response to the external voltage not reaching the third predetermined voltage, the comparator does not enable a wake-up signal so that the processing circuit operates in the power-down mode, and
   in response to the external voltage reaching the third predetermined voltage, the comparator enables the wake-up signal so that the processing circuit exits the power-down mode and enters the operation mode.

5. The control circuit as claimed in claim 1, wherein the wake-up event is the duration of the processing circuit operating in the power-down mode reaching a predetermined value.

6. The control circuit as claimed in claim 5, wherein:
   the wake-up circuit is a timer,
   in response to the counter value of the timer not reaching a target value, the timer does not enable a wake-up signal so that the processing circuit continues to operate in the power-down mode, and
   in response to the counter value of the timer reaching the target value, the timer enables the wake-up signal so that the power-down mode exits the power-down mode and enters the operation mode.

7. The control circuit as claimed in claim 1, further comprising:
   a driving circuit generating a driving signal and sending the driving signal to the processing circuit in response to the external voltage reaching the first predetermined voltage.

8. The control circuit as claimed in claim 7, wherein:
   the driving circuit is a voltage converter circuit,
   the voltage converter circuit converts the external voltage to generate an output voltage, uses the output voltage as the driving voltage, and provides the driving voltage to the processing circuit.

9. The control circuit as claimed in claim 8, wherein:
   the driving circuit is a clock source,
   the clock source generates a clock signal, uses the clock signal as the driving signal, and provides the driving signal to the processing circuit.

10. The control circuit as claimed in claim 1, wherein in response to the processing circuit entering the power-down mode, the wake-up circuit stops detecting the occurrence of the wake-up event.

11. A control method applied in a micro-controller and comprising:
   detecting an external voltage;
   accessing a register in response to the external voltage reaching a first predetermined voltage;
   directing the micro-controller to enter a power-down mode in response to the external voltage reaching a second predetermined voltage, wherein in the power-down mode, the micro-controller stops accessing the register;
   determining whether a wake-up event occurs;
   directing the micro-controller to operate in the power-down mode in response to there being no wake-up event; and
   directing the micro-controller to enter an operation mode in response to the wake-up event,
   wherein in the operation mode, the micro-controller executes a program code.

12. The control method as claimed in claim 11, further comprising:
   deactivating the micro-controller so that the micro-controller stops operating in response to the external voltage not reaching the first external voltage.

13. The control method as claimed in claim 11, further comprising:
   determining whether the external voltage has reached a third predetermined voltage in response to the external voltage reaching the second predetermined voltage and the micro-controller entering the power-down mode;
   directing the micro-controller to operate in the power-down mode in response to the external voltage not reaching the third predetermined voltage; and
   waking-up the micro-controller so that the micro-controller exits the power-down mode and enters the operation mode in response to the external voltage reaching the third predetermined voltage.

14. The control method as claimed in claim 13, wherein the third predetermined voltage is higher than the second predetermined voltage, and the second predetermined voltage is higher than the first predetermined voltage.

15. The control method as claimed in claim 11, wherein the wake-up event is the duration of the micro-controller being in the power-down mode reaching a predetermined value.

16. The control method as claimed in claim 11, further comprising:
   activating a timer to adjust a counter value in response to the external voltage reaching the second predetermined voltage and the micro-controller operating in the power-down mode;
   determining whether the counter value has reached a target value;
   directing the micro-controller to operate in the power-down mode in response to the counter value not reaching the target value; and
   waking-up the micro-controller so that the micro-controller exits the power-down mode and enters the operation mode in response to the counter value reaching the target value.

17. The control method as claimed in claim 11, further comprising:
   converting the external voltage to generate a driving voltage in response to the external voltage reaching the first predetermined voltage; and
   providing the driving voltage to the micro-controller.

18. The control method as claimed in claim 11, further comprising:
   generating a clock signal in response to the external voltage reaching the first predetermined voltage; and
   providing the clock signal to the micro-controller.

19. The control method as claimed in claim 11, further comprising:
   stopping the determination of whether a wake-up event occurs.

20. An electronic device receiving a power from an external device and comprising:
   an energy storage circuit storing the power to provide an external voltage;
   a storage circuit comprising a register and storing a program code;
   a voltage detection circuit detecting the external voltage;
   a processing circuit accessing the register in response to the external voltage reaching a first predetermined voltage, entering a power-down mode in response to the external voltage reaching a second predetermined voltage, and stopping the access of the register in the power-down mode; and
   a wake-up circuit determining whether a wake-up event occurs,
   wherein:
   in response to the wake-up event, the wake-up circuit directs the processing circuit to exit the power-down mode and enter an operation mode,
   in response to there being no wake-up event, the processing circuit operates in the power-down mode, and
   in the operation mode, the processing circuit executes the program code.

* * * * *